US012298453B2

(12) United States Patent
Heibel et al.

(10) Patent No.: US 12,298,453 B2
(45) Date of Patent: *May 13, 2025

(54) DEVICES, SYSTEMS, AND METHODS FOR DETECTING RADIATION WITH SCHOTTKY DIODES FOR ENHANCED IN-CORE MEASUREMENTS N-CORE MEASUREMENTS

(71) Applicant: Westinghouse Electric Company LLC, Cranberry Township, PA (US)

(72) Inventors: Michael D. Heibel, Broomfield, CO (US); Jeffrey L. Arndt, Pittsburgh, PA (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/484,780

(22) Filed: Oct. 11, 2023

(65) Prior Publication Data

US 2024/0125950 A1    Apr. 18, 2024

Related U.S. Application Data

(63) Continuation of application No. 17/754,408, filed as application No. PCT/US2020/053757 on Oct. 1, 2020, now Pat. No. 11,841,469.

(Continued)

(51) Int. Cl.
*G01T 1/24*   (2006.01)
*G01T 1/36*   (2006.01)
(Continued)

(52) U.S. Cl.
CPC .............. *G01T 1/248* (2013.01); *G01T 1/366* (2013.01); *G21C 17/108* (2013.01); *H10D 8/60* (2025.01)

(58) Field of Classification Search
CPC ....... G01T 1/248; G01T 1/366; G21C 17/108; H01L 29/872; Y02E 30/30
See application file for complete search history.

(56) References Cited

U.S. PATENT DOCUMENTS 6,236,698 B1    5/2001  Hirukawa et al.
6,252,923 B1    6/2001  Tacovino et al.
(Continued)

FOREIGN PATENT DOCUMENTS

TW    I592945 B    7/2017
TW    I782336 B    11/2022
(Continued)

OTHER PUBLICATIONS

International Search Report and Written Opinion for International PCT Application No. PCT/US2020/053757, dated Dec. 17, 2020.
(Continued)

*Primary Examiner* — David P Porta
*Assistant Examiner* — Gisselle M Gutierrez
(74) *Attorney, Agent, or Firm* — K&L Gates LLP

(57) ABSTRACT

An in-core detector configured to measure a power distribution in a nuclear reactor is disclosed herein. The in-core detector includes a housing configured to be placed within a predetermined location of the nuclear reactor and a plurality of a gamma detectors. Each gamma detector of the plurality of gamma detectors includes a Schottky diode including an active semiconductor region and a Schottky contact, an Ohmic contact, a photoelectron source material configured to transfer electrons to the active region upon contact with gamma radiation, and a first and second lead. The plurality of gamma detectors are positioned within the housing such that each gamma detector of the plurality of gamma detectors is radially offset relative to an adjacent gamma detector of the plurality of gamma detectors, such that the first and (Continued)

second leads of each gamma detector are offset relative to the first and second leads of the adjacent gamma detector.

22 Claims, 5 Drawing Sheets

Related U.S. Application Data

(60) Provisional application No. 62/910,610, filed on Oct. 4, 2019.

(51) Int. Cl.
*G21C 17/108* (2006.01)
*H01L 29/872* (2006.01)
*H10D 8/60* (2025.01)

(56) References Cited

U.S. PATENT DOCUMENTS

| | | |
|---|---|---|
| 6,596,998 B1 | 7/2003 | Siedel |
| 8,258,482 B2* | 9/2012 | Nikolic ............ G01T 1/24 |
| | | 438/57 |
| 9,251,920 B2 | 2/2016 | Loewen et al. |
| 9,831,375 B2 | 11/2017 | Heibel et al. |
| 11,841,469 B2 | 12/2023 | Heibel |
| 12,044,815 B2* | 7/2024 | Heibel ............ H01L 31/118 |
| 2002/0195569 A1 | 12/2002 | Seidel et al. |
| 2013/0285068 A1* | 10/2013 | Heibel ............ H01L 31/108 |
| | | 257/77 |
| 2019/0267145 A1 | 8/2019 | Saito et al. |
| 2022/0342093 A1* | 10/2022 | Heibel ............ H01L 29/872 |
| 2023/0168398 A1* | 6/2023 | Heibel ............ G01T 1/36 |
| | | 250/370.14 |
| 2024/0125950 A1* | 4/2024 | Heibel ............ G21C 17/108 |

FOREIGN PATENT DOCUMENTS

| | | |
|---|---|---|
| WO | 2018096579 A1 | 5/2018 |
| WO | 2021067570 A1 | 4/2021 |

OTHER PUBLICATIONS

Search Report for corresponding TW Application No. 109134493, dated Mar. 10, 2022.

\* cited by examiner

DEVICES, SYSTEMS, AND METHODS FOR DETECTING RADIATION WITH SCHOTTKY DIODES FOR ENHANCED IN-CORE MEASUREMENTS N-CORE MEASUREMENTS

CROSS-REFERENCE TO RELATED APPLICATIONS

This application is a continuation application claiming priority under 35 U.S.C. § 120 to U.S. patent application Ser. No. 17/754,408, entitled DEVICES, SYSTEMS, AND METHODS FOR DETECTING RADIATION WITH SCHOTTKY DIODES FOR ENHANCED IN-CORE MEASUREMENTS N-CORE MEASUREMENTS, filed Mar. 31, 2022, now U.S. Pat. No. 11,841,469, issued Dec. 12, 2023, which is a U.S. National Stage Entry under 35 U.S.C. § 371 of International Patent Application No. PCT/US2020/053757, entitled DEVICES, SYSTEMS, AND METHODS FOR DETECTING RADIATION WITH SCHOTTKY DIODES FOR ENHANCED IN-CORE MEASUREMENTS, filed Oct. 1, 2020, which claims benefit under 35 U.S.C. § 119 (e) to U.S. Provisional Patent Application No. 62/910,610, filed Oct. 4, 2019, the entire disclosures of which are hereby incorporated by reference herein.

FIELD

The present invention relates to radiation detectors, and more particularly to an assembly that includes a plurality of Schottky diodes configured to measure fission gamma radiation for power distribution measurements.

BACKGROUND

Gamma radiation is created by nuclear decay, including the decay associated with nuclear fission, which occurs in nuclear reactors. Nuclear reactors are traditionally equipped with measurement systems to detect and measure gamma radiation. However, new nuclear fuel assemblies and reactor designs present challenges to the ability of existing measurement systems and their ability to confirm fuel design performance predictions and to take detailed operation performance measurements during a fuel cycle.

The design of a nuclear reactor can rely on software simulations for core design and fuel performance projections, including projections for reactor components in both normal operating conditions and in a variety of accident scenarios. The software performance projections are eventually compared to actual measurements under normal operating conditions, or simulations thereof in test reactors, in a commercial or test reactor.

Older light water reactor designs utilized miniature fission chambers to take actual performance measurements to compare with the software projections. For example, such chambers could measure a neutron flux along the length of roughly one third of the fuel assemblies in the reactor to generate a benchmark power distribution measurement to be used to verify software projections and/or to assist in the projections for new designs. This type of measurement system is commonly known as a movable in-core detector system. Movable in-core detector measurement systems typically include finely-spaced axial neutron distribution (e.g. ~2.4 inches), which can provide a desired measurement resolution that allows for the identification and diagnosis of many fuel performance issues. Such performance issues could cause significant reactor operation issues, such as fuel rod bow, debris deposits on the outside of fuel rods that affect heat transfer or reactivity, and inlet flow distribution asymmetries. However, movable in-core detector systems can be problematic based on their complexity, required size, and operation and maintenance costs associated with use of the associated piping and sensors. These problems are only exacerbated as core and fuel assembly designs continue to evolve.

Alternatively, a new generation of power distribution measurement systems for reactors has emerged, commonly known as fixed in-core detector systems. Fixed in-core detector systems rely on a limited number of radiation sensors in fixed axial and radial locations inside the reactor core. As will be discussed further, the signals from a fixed in-core detector sensor can represent an average reactor power over the fixed axial region defined by the active length of the sensing element. However, radial distributions of fixed in-core detector measurements across a fuel assembly can require—and thus, be constrained to—certain locations of the reactor vessel, such as those associated with penetrations. The aforementioned averaging and location constraints can make it difficult to obtain highly localized and detailed measurements using fixed in-core detector systems. Accordingly, it can be more difficult to obtain sufficient real-time performance measurements across a core and/or fuel assembly using a fixed in-core detector system, thereby making it harder to verify performance projections for power distribution and/or long-term operating characteristics. The ability to detect these differences could be crucial qualifying the design of reactors and in the safe operation of both the fuel and the reactor. Accordingly, there is a need for devices, systems, and methods for in-core radiation detection that are more versatile and cost efficient that movable in-core detection systems and fixed in-core detection systems, without compromising accuracy.

SUMMARY

The following summary is provided to facilitate an understanding of some of the innovative features unique to the aspects disclosed herein, and is not intended to be a full description. A full appreciation of the various aspects can be gained by taking the entire specification, claims, and abstract as a w % bole.

In various aspects, an in-core detector configured to measure a power distribution in a nuclear reactor is disclosed. The in-core detector includes a housing configured to be placed in a predetermined location of the nuclear reactor, a plurality of a gamma detectors, wherein each gamma detector of the plurality of gamma detectors includes a Schottky diode having an active semiconductor region and a Schottky contact over at least a portion of the active semiconductor region, an Ohmic contact under at least a portion of the active semiconductor region, a photoelectron source material configured to transfer electrons to the active region of the Schottky diode upon contact with gamma radiation emitted by the nuclear reactor, a first lead extending proximate the source material, and a second lead extending proximate the Ohmic contact layer, wherein the plurality of gamma detectors are positioned within the housing such that each gamma detector of the plurality of gamma detectors is radially offset relative to an adjacent gamma detector of the plurality of gamma detectors, such that the first and second leads of each gamma detector are offset relative to the first and second leads of the adjacent gamma detector.

In various aspects, an in-core detector system configured to measure gamma radiation emitted by a nuclear reactor is disclosed. The in-core detector system includes a housing configured to be placed in a predetermined location within the nuclear reactor, wherein the housing extends in an axial dimension a plurality of gamma detectors stacked axially within the housing, wherein each gamma detector of the plurality of gamma detectors includes a Schottky diode including an active semiconductor region and a Schottky contact over at least a portion of the active semiconductor region, and a photoelectron source material, wherein the photoelectron source material is configured to produce energy that penetrates the active region when it contacts gamma radiation emitted by the nuclear reactor.

In various aspects, a gamma detector of a plurality of gamma detectors stacked axially within a housing of an in-core detector system, wherein the plurality of gamma detectors are configured to measure gamma radiation emitted by a nuclear reactor is disclosed. The gamma detector includes a Schottky diode including an active semiconductor region and a Schottky contact over at least a portion of the active semiconductor region, a conductive material configured to generate a charge within the active semiconductor region, and a photoelectron source material, wherein the photoelectron source material is configured to produce energy that penetrates the active region when it contacts gamma radiation emitted by the nuclear reactor, wherein the photoelectron source material is positioned a distance away from the Schottky contact, thereby creating a gap between the photoelectron source material and the Schottky contact.

BRIEF DESCRIPTION OF THE DRAWINGS

Various features of the aspects described herein, together with advantages thereof, may be understood in accordance with the following description taken in conjunction with the accompanying drawings as follows.

Corresponding reference characters indicate corresponding parts throughout the several views. The exemplifications set out herein illustrate various aspects of the invention, in one form, and such exemplifications are not to be construed as limiting the scope of the invention in any manner.

DETAILED DESCRIPTION

Figure 1:
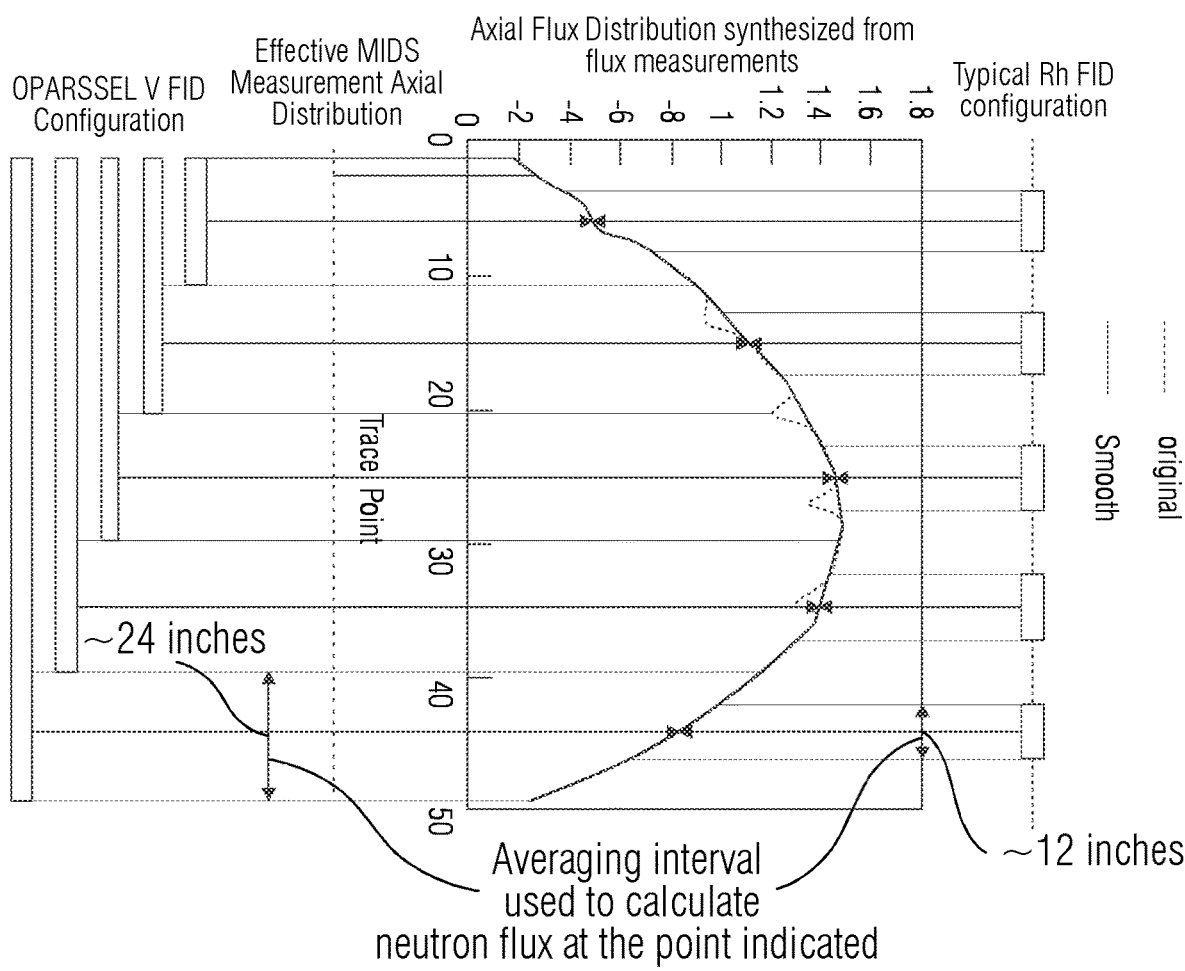
FIG. 1 illustrates a chart of axial power distribution measurements as taken by known means and/or methods of in-core detection.

Numerous specific details are set forth to provide a thorough understanding of the overall structure, function, manufacture, and use of the aspects as described in the specification and illustrated in the accompanying drawings. Well-known operations, components, and elements have not been described in detail so as not to obscure the aspects described in the specification. The reader will understand that the aspects described and illustrated herein are non-limiting examples, and thus it can be appreciated that the specific structural and functional details disclosed herein may be representative and illustrative. Variations and changes thereto may be made without departing from the scope of the claims.

As used herein, the singular form of "a". "an", and "the" include the plural references unless the context clearly dictates otherwise.

Directional phrases used herein, such as, for example and without limitation, top, bottom, left, right, lower, upper, front, back, and variations thereof, shall relate to the orientation of the elements shown in the accompanying drawing and are not limiting upon the claims unless otherwise expressly stated.

In the present application, including the claims, other than where otherwise indicated, all numbers expressing quantities, values or characteristics are to be understood as being modified in all instances by the term "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

As used herein "axially" means in the direction of or in alignment with an axis. With respect to two or more objects, axially means the objects are positioned along an axis, either in a co-axial alignment or parallel to an axis.

As used herein, "radially spaced" means two or more objects are positioned such that the objects are spaced from each other along an arc of a circle, or placed along a radius.

In-core detector systems can be used to verify and/or improve reactor operation and design by providing continuous, real-time measurements of actual core conditions. However, as the design of a reactor and its fuel assembly evolves, new means and/or methods of in-core detection of real-time operating conditions are necessary to ensure the accuracy of measurements and thus, improve the verification of performance predictions throughout the life of the reactor.

As previously discussed, both movable and fixed in-core detection systems are known to be used to produce such measurements but each has deficiencies that can prohibit the acquisition of localized measurements for cores and/or fuel assemblies, regardless of geometric design. Referring now to FIG. 1, a chart comparing axial power distribution measurements across a reactor is depicted in accordance with several known means and/or methods, including fixed in-core detector systems. As is evident by their name, fixed in-core detector systems are not configured to be moved throughout the core in the same manner movable in-core detector systems do. Rather, the fixed in-core detector systems of FIG. 1 determine an average reactor power distribution over a fixed axial region, as defined by the active length of the sensing elements of the system.

The fixed nature of the means and/or methods of FIG. 1 can effect the accuracy of real-time measurements and/or hinder the versatility of the measurement systems. For example, the means and/or methods of FIG. 1 can be constrained to positions on the reactor where penetrations are located. Since the known means and/or methods of FIG. 1 are fixed, rely on averages, and include constraints on their installation and use, the means and/or methods of FIG. 1 make it difficult to obtain localized, detailed, and accurate real-time measurements. Accordingly, there is a need for improved means and/or methods of obtaining continuous, real-time, measurements of actual core conditions that are more efficient and economical than a movable in-core detection system, but more accurate and detailed than a fixed in-core detection system. This need is only enhanced as the specific design and/or configuration of nuclear reactors and fuel assemblies continues to evolve.

Figure 2:
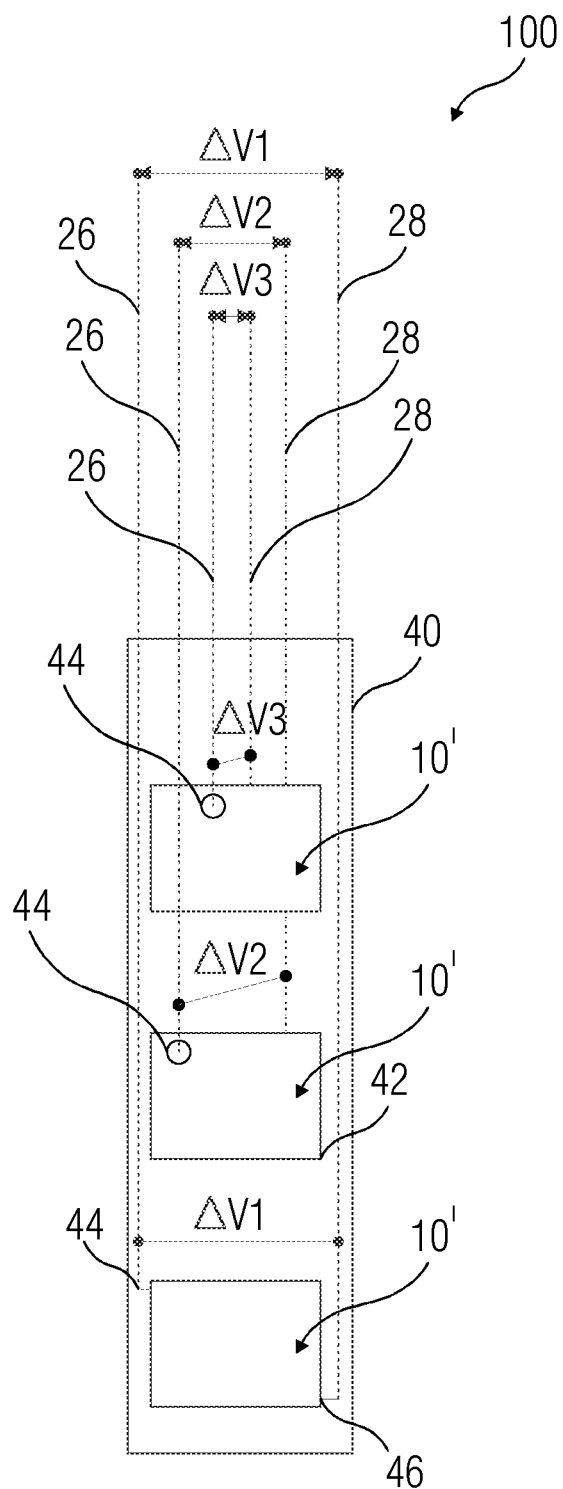
FIG. 2 illustrates a sectioned side view of an improved in-core detector system, in accordance with at least one aspect of the present disclosure.

Referring to FIG. 2, a versatile system 100 configured to detect in-core power distribution is depicted in accordance with at least one aspect of the present disclosure. The assembly of FIG. 2 can be suitable for measuring a power distribution across nuclear fuel assemblies and reactors with a wide variety of designs. According to the non-limiting aspect of FIG. 2, the system 100 can include a plurality of gamma detectors 10'. According to one non-limiting aspect of the present disclosure, the plurality of gamma detectors 10' can be positioned axially, one on top of another. The system 100 of FIG. 2 includes an elongate container, such as a tube 40, which is configured to contain the plurality of gamma detectors 10'. Each detector 10' of the plurality of gamma detectors 10' can include one or more leads 26, 28. According to the non-limiting aspect of FIG. 2, the plurality of gamma detectors 10' can be composed as an axial stack, and each gamma detector 10' of the plurality of gamma detectors 10' can be rotated relative to another along the length of the tube 40. Accordingly, the one or more leads 26, 28 of each gamma detector 10' can be configured such that they do not interfere with the leads 26, 28 of the other detectors. It shall be appreciated that the configuration of FIG. 2 can maximize the density of gamma detectors 10' and thus, the measurements that can be obtained via the system 100.

In further reference of FIG. 2, each gamma detector 10' of the plurality of gamma detectors 10' contained within the tube 40 of system 100 can be modified to include the form and/or function of any of the detectors described in U.S. Pat. No. 9,831,375, the disclosure of which is hereby incorporated by reference. According to some non-limiting aspects, one or more of the gamma detectors 10' can include a Schottky diode having an active semiconductor region and a Schottky contact over at least a portion of the semiconductor region. For example, one or more detectors 10' can include a composition similar to the composition depicted in FIG. 3, which is described in detail in U.S. Pat. No. 9,831,375.

Figure 3:
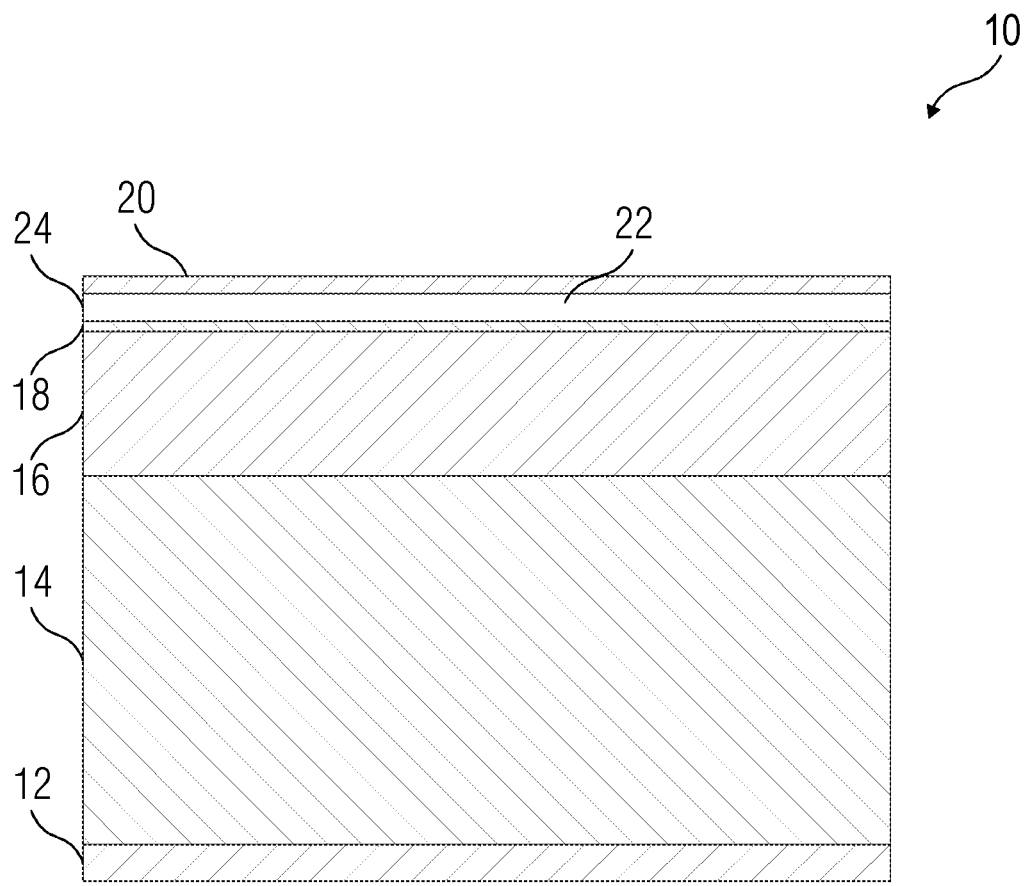
FIG. 3 illustrates a sectioned side view of a known gamma detector that can be integrated into the system of FIG. 2, in accordance with at least one non-limiting aspect of the present disclosure.

Referring now to FIG. 3, a sectioned side view of a known gamma detector that can be integrated into the system 100 of FIG. 2 is depicted in accordance with at least one non-limiting aspect of the present disclosure. According to the non-limiting aspect of FIG. 3, the gamma detector 10 can include an Ohmic contact layer 12. Although the Ohmic contact layer 12 can include a composition of tungsten, it shall be appreciated that any number of suitable materials with desirable electrically resistive properties can be utilized. The Ohmic contact layer 12 can be positioned beneath a silicon carbide conducting substrate 14, which can be covered by a layer of epitaxial silicon carbide 16. According to the non-limiting aspect of FIG. 3, the substrate 14 can include a thickness of approximately 300 microns and the epitaxial layer 16 in various aspects is approximately from 3 to 100 microns in thickness and the epitaxial silicon carbide layer 16 can be covered by a Schottky contact 18. The Schottky contact 18 can be formed from any highly conductive metal such as platinum or gold, about 1 micron in thickness. It shall be further appreciated that the specific materials and dimensions of the gamma detector 10 of FIG. 3 are presented for illustrative purposes only. Accordingly, the present disclosure contemplates gamma detectors 10 of any suitable material and/or dimension, including but not limited to those disclosed in U.S. Pat. No. 9,831,375.

Still referring to FIG. 3, the gamma detector 10 can further include a thin layer 20 of a Compton and photoelectron source material. This layer 20 can be made for example, from platinum or any other suitable high-atomic donor material, including lithium fluoride or tungsten, amongst others. According to the non-limiting aspect of FIG. 3, the layer 20 can be positioned above and spaced from at least a portion of the Schottky contact 18, thereby defining a gap 22 that can, in response to incident gamma radiation, release electrons. The released electrons can penetrate the active region 16 and contribute to the collection of charged particles in active region 14. In response to incident gamma radiation, the source or electron radiator material 20 can release electrons that will penetrate the active region 16 and contribute to the collection of charged particles in the active region 14.

In further reference to FIG. 3, the distance defined by gap 22 between the Schottky contact 18 and added source layer 20 can be adjustable and, according to some non-limiting aspects, can include a fluid with a low effective atomic number and negligible conductance. For example, a fluid including properties similar to those of air at 1 atmosphere of pressure with a relative humidity less than or equal to 20 percent at 70° F. (21° C.) can be positioned between the electron donor layer 20 and the Schottky contact 18. It shall be appreciated that any such fluid including suitable density and electron attenuation properties can be used in gap 22. Furthermore, the gap 22 between the source layer 20 and the Schottky contact 18 can be configured such that only electrons produced by gamma radiation of a desired energy will contribute to the measured signal.

It shall be further appreciated that the specific material and thickness of the source layer 20 of FIG. 3 can be selected based, at least in part, on an energy range of the gamma radiation to be targeted by the in-core detector system, according to user preferences and/or the intended application. Additionally and/or alternatively, an adjustable electron donor layer—symbolically represented by a telescoping sleeve surrounding the layer 24—can be specifically configured to facilitate the interaction between the targeted gamma radiation and the electrons surrounding the source atoms in the donor material 20. This can produce high energy Compton and photoelectrical electrons inside the donor layer that penetrate into the active region 16 of the silicon carbide detector 10. The adjustable electron donor layer can be adjustable in thickness and distance from the Schottky contact 18, such that the interaction can be attenuated, as desired. For example, the thickness of an intervening fluid, which can be positioned within gap 22, can control the energy of donor electrons so that they are collected in the active region. Accordingly, the charge deposited over a fixed amount of time can be proportional to the energy of the gamma radiation incident upon the layer 20, such that the gamma energy and gamma radiation intensity can be determined from an analysis of electrical outputs produced by the gamma detector 10.

Figure 4:
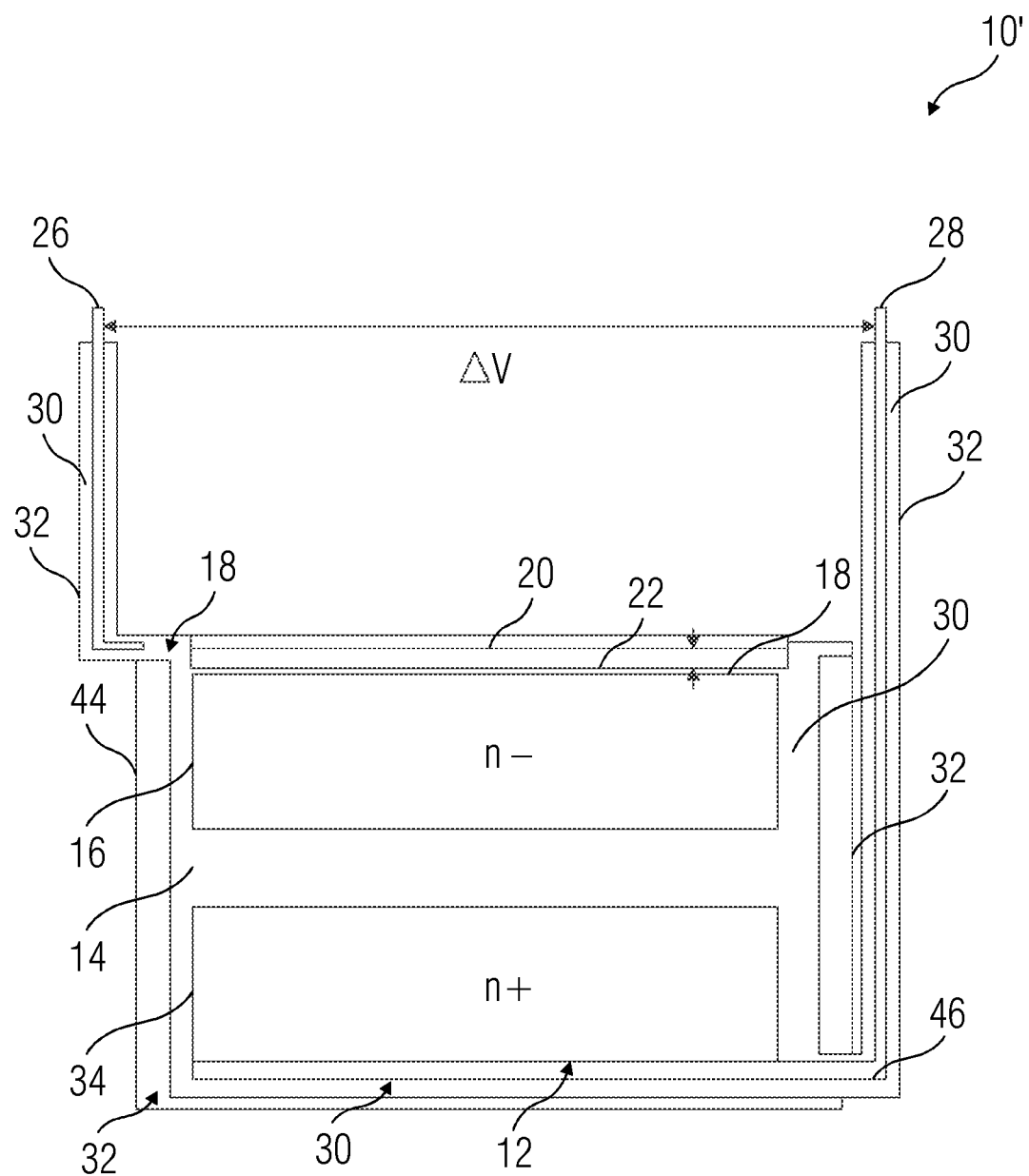
FIG. 4 illustrates a sectioned side view of another gamma detector that can be integrated into the system, of FIG. 2, in accordance with at least one non-limiting aspect of the present disclosure

Referring now to FIG. 4, another example of a gamma detector 10 that can be integrated into system 100 (FIG. 2) is depicted in accordance with at least one non-limiting aspect of the present disclosure. According to the non-limiting aspect of FIG. 4, the gamma detector 10' is similar to the gamma detector 10 of FIG. 3, but intentionally modified. For example, the modified detector 10' of FIG. 4 can include an insulating layer 34 positioned between the Ohmic contact layer 12 and the conducting layer 14 of the gamma detector 10'. Accordingly, the insulating layer 34 can prevent an unintentional discharge of electrons and thus, the short circuiting of the tungsten Ohmic contact 12.

In further reference of FIG. 4, the active regions of the modified detector 10' can include the SiC layers 14 and 16. For example, according to some non-limiting aspects, the epitaxial layer 16 can be made of SiC that has been doped with a source of additional electrons. The source of additional electrons can provide the epitaxial layer 16 with a layer a negative charge, denoted by n⁻. According to other non-limiting aspects, the conducting layer 14 can additionally and/or alternatively be formed from SiC that has been doped with a material that accepts electrons. Thus, the source of additional electrons can provide the conducting layer 14 with a positive charge, denoted by n⁺. Accordingly, a reverse bias can deplete n in the active region 16 and ionizing radiation can produce electron-hole pairs in the depleted region. The charge can be collected under the influence of an applied voltage across the contacts.

Still referring to FIG. 4, the active region of gamma detector 10' can include an epitaxial layer 16 that includes two regions, one positively doped layer and one negatively doped layer. The positively doped layer and negatively doped layer can be of specifically configured thicknesses to accomplish a desired effect. For example, the positively doped layer can include a thickness of approximately one micron and the negatively doped layer can include a thickness of approximately three to ten microns. Additionally and/or alternatively, the conductive layer 14 can include hydrogen ions, according to user preference and/or intended application.

It shall be appreciated that the system 100 (FIGS. 2 and 5) and specifically, the arrangement of gamma detectors 10' can be sized and/or configured to facilitate the acquisition of localized measurements across a wide variety of core and/or fuel assembly designs. According to the non-limiting aspect of FIG. 4, the modified gamma detector 10' can be relatively small. For example, the modified gamma detector 10' can be less than about 5 mm³. The gamma detector 10' can be configured to detect a predetermined minimum amount of radiated energy (e.g. less than approximately five MeV) by adjusting a distance between the source material 20 and the n⁻ region of the SiC, epitaxial layer 16. Accordingly, the system 100 can employ a large number gamma detectors 10' that positioned relatively close to one another, thereby facilitating the acquisition of localized measurements and eliminating the "averaging" approach of fixed in-core detectors.

In further reference to FIG. 4, an exterior surface of detector 10' can be covered by an intermediate layer 30 that—according to some non-limiting aspects—can be made of an electrical dielectric (e.g. aluminum oxide ($Al_2O_3$), magnesium oxide (MgO), and/or the like) that is configured to isolate conductive materials within the gamma detector 10'. According to some non-limiting aspects, the intermediate layer 30 can be further covered by an outer layer 32 of a preferable material (e.g. stainless steel, Iconel™, aluminum oxide, and/or the like). The outer layer 32 can be configured to act as an enclosure that provides structural integrity to the gamma detector 10'.

According to the non-limiting aspect of FIG. 4, a first lead 26 can also covered by the intermediate layer 30 and the outer layer 32, and configured to extend from the top of the gamma detector 10' near the source material layer 20 at point 44. Likewise, a second lead 28 can covered by the intermediate layer 30 and the outer layer 32 and configured to extend from the bottom of detector 10' near the Ohmic contact layer 12 at point 46. According to the non-limiting aspect of FIG. 4, the first and second leads 26 and 28 can be positioned on opposite sides of the gamma detector 10'. Therefore, in a radial configuration, the first lead 26 and second lead 28 of a gamma detector 10' can, for example, be positioned 180° apart from each other. The distance between the first lead 26 and second lead 28 is denoted in FIGS. 2, 4, and 5 by $\Delta V$, representing the difference in voltage.

Figure 5:
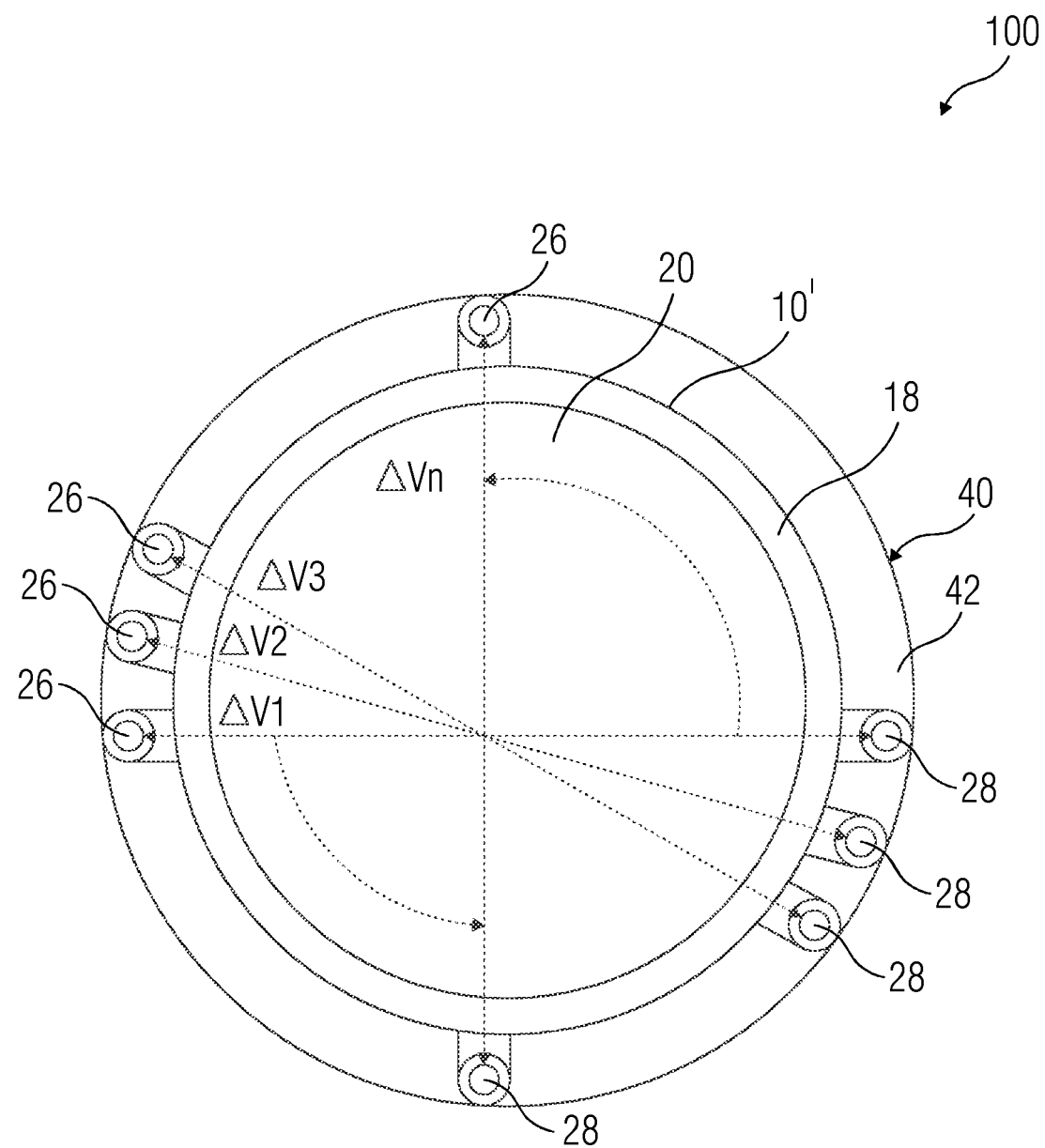
FIG. 5 illustrates a sectioned view of the system 100 of FIG. 2, in accordance with at least one non-limiting aspect of the present disclosure.

Referring now to FIG. 5, a sectioned view of the system 100 of FIG. 2 is depicted in accordance with at least one non-limiting aspect of the present disclosure. According to the non-limiting aspect of FIG. 5, the system 100, including its tube 40 and gamma detectors 10', is illustrated. Three sets of leads 26/28 can be separated by distances denoted $\Delta V1$, $\Delta V2$, and $\Delta V3$, and another set denoted by $\Delta Vn$, which indicates that any number of "n" additional detectors 10' can be included in the system 100 of FIG. 5. As is depicted in FIG. 2, the present disclosure contemplates a plurality of detectors 10' to increase the number of localized measurements the system 100 is capable of. According to some non-limiting aspects, as many as 61 detectors 10' can be placed in a typical instrument tube 40 used in a nuclear reactor (not shown). It shall be appreciated that the number of gamma detectors 10' included in a tube 40 of the system 100 can vary depending on the length of the tube 40 and measurement capabilities driven by the reactor design and thus, required of the system 100. The gamma detectors 10' can be arranged such that the leads 26/28 of each detector 10' are radially spaced from the leads 26/28 of the rest of the detectors 10' in the tube 40. Accordingly, the system 100 of FIGS. 2 and 5 can mitigate—if not eliminate—the contribution of undesired fission product gamma radiation in the measured signals.

It shall be appreciated that the system 100 and specifically, the arrangement of gamma detectors 10' of FIGS. 2 and 5 can be sized and/or configured to facilitate the acquisition of localized measurements across a wide variety of core and/or fuel assembly designs. For example, in some non-limiting aspects, the gamma detectors 10' can be positioned at varying positions relative to one another inside and along the length of the tube 40. For example, the gamma detectors 10' can be closely spaced to improve the accuracy of in-detector measurements taken by the system 100. This can enable an improved localization of measurements taken by the system 100, thereby improving system 100 performance over the previously discussed fixed in-core detector systems. As used herein. "closely spaced" can mean less than about twelve inches, and in various aspects, less than or equal to about two to three inches, and preferably about 2.4 inches or less, equivalent to or less than the spacing in the finely-spaced axial neutron distribution measurement resolution (~2.4 inches) provided by movable in-core detector measurement systems. However, according to some non-limiting aspects, the gamma detectors 10' can be positioned at any desired distance relative to one another in accordance with user-preference and/or intended application to optimize the degree of localization of acquired measurements taken by the system 100. Indeed, the size and efficiency of the gamma detectors 10' of FIG. 4 imbue the system 100 with versatility that can be applied to a wide variety of core designs.

Additionally and/or alternatively, the overall system 100 configuration can be customized to enhance versatility and improve performance. For example, the tube 40 of FIGS. 2 and 5 can be specifically configured to include an outer diameter that is small enough to fit, for example, inside the fuel assembly central instrument thimble or other strategic measurement location inside or around the reactor and/or inside the reactor vessel. However, it shall be appreciated that the system 100 can include any number of geometric features and/or dimensions to enable its installation in any desired location of the core and/or fuel assembly. Similar to the degree of customization presented by the gamma detectors 10', the overall system 100 configuration can be attenuated in accordance with user preference and/or intended application. Accordingly, in other non-limiting aspects, the system 100 is effectively implemented across any number of core designs, because the aforementioned scalability enables users to reduce its size without compromising performance. This geometric versatility provides an obvious improvement over known movable and fixed in-core reactors, as previously discussed.

According to some non-limiting aspects, a SiC signal response can be predicted by core design software for each of the many gamma detectors 10' located within or around the reactor core. The use of a system 100—such as the system 100 of FIGS. 2 and 5—with small, closely spaced, gamma detectors 10' can essentially eliminate the effects of averaging flux measurements over long fuel assembly lengths, as previously discussed in relation to the fixed in-core detection system measurements depicted in FIG. 1. As previously discussed, the necessary averaging and radial distribution location constraints of the currently used fixed in-core detector systems makes it difficult to observe the differences between highly localized and detailed measurements versus predicted power distribution and long term operating characteristic.

In further reference to the system 100 of FIGS. 2 and 5, the disclosed configuration of gamma detectors 10' can closely mimic the distribution of the movable in-core detector system movable fission chamber axial measurement density (e. g. one per 2.4 inches). Thus, the system 100 can have the ability to resolve the impact of grids, debris deposits on the outside of fuel rods that affect heat transfer, reactivity (e.g. CRUD), and/or local boiling have on the reactor core. This can allows for a more accurate synthesis of the axial flux distribution to be developed. The differences between the measured and predicted detector 10' signals can be used to determine the accuracy of the core design modeling tools in high detail, and produce a highly detailed core power distribution measurement that can be used to identify the presence of fuel performance anomalies.

Furthermore, the system 100 of FIGS. 2 and 5 can be positioned permanently inside all of the fuel assembly instrument thimbles or inside prepared positions in the reactor fuel matrix. The signal leads 26/28 can be used to output the detector signals in the detector tubes 40 are oriented as shown on FIGS. 2 and 5 to allow a desired SiC sensing element active volume surface area and axial density while using standard mineral insulated cable designs for the signal leads. The SiC signals will utilize a common reactor ground to simplify the configuration of the electrical connector that joins the measured voltage differences to the signal processing electronics.

Several benefits of the non-limiting system 100 of FIGS. 2 and 5 include, for example:

(1) The use of a rotating arrangement as a function of axial position of the detectors 10' inside the tube 40 maximizes the number of identical detectors 10' that can be contained within the tube 40 and minimizes the required outer diameter of the dry tube 40.

(2) The use of SiC detectors 10' in system 100 that are tuned by adjusting gap 22 in each detector 10' to detect the maximum energy prompt fission gamma energies allows a continuous measurement of the reactor fission power distribution. This prompt fission information can be used for reactor anomaly detection, continuous power distribution monitoring, and reactor protection from a single sensor design.

(3) The use of the gamma sensitive SiC detector 10' system 100 design may allow this assembly to remain in service for the life of the reactor since there are no components that should degrade or diminish as a function of radiation exposure.

(4) The thermal characteristics of the SiC detector design shown on FIG. 5 may allow use in designs for pressure water reactors, boiling water reactors, high-temperature gas-cooled reactors, and liquid metal cooled reactors.

In principle the in-core detector system 100 design and configuration of FIGS. 2 and 5 can displace all other radiation sensors used in nuclear reactor operations. Moreover, the effort to transition from current measurement systems to the radiation detector system 100 described herein should be very easy and cost-effective.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative aspects. The aspects described herein are understood as providing illustrative features of varying detail of various aspects of the disclosed invention; and therefore, unless otherwise specified, it is to be understood that, to the extent possible, one or more features, elements, components, constituents, ingredients, structures, modules, and/or aspects of the disclosed aspects may be combined, separated, interchanged, and/or rearranged with or relative to one or more other features, elements, components, constituents, ingredients, structures, modules, and/or aspects of the disclosed aspects without departing from the scope of the disclosed invention. Accordingly, it will be recognized by persons having ordinary skill in the art that various substitutions, modifications or combinations of any of the exemplary aspects may be made without departing from the scope of the invention. In addition, persons skilled in the art will recognize, or be able to ascertain using no more than routine experimentation, many equivalents to the various aspects of the invention described herein upon review of this specification. Thus, the invention is not limited by the description of the various aspects, but rather by the claims.

Various aspects of the subject matter described herein are set out in the following numbered clauses:

Clause 1: An in-core detector configured to measure a power distribution in a nuclear reactor, the in-core detector including a housing configured to be placed within a predetermined location of the nuclear reactor, a plurality of a gamma detectors, wherein each gamma detector of the plurality of gamma detectors includes a Schottky diode having an active semiconductor region and a Schottky contact over at least a portion of the active semiconductor region, an Ohmic contact under at least a portion of the active semiconductor region, a photoelectron source material configured to transfer electrons to the active region of the Schottky diode upon contact with gamma radiation emitted by the nuclear reactor, a first lead extending proximate the source material, and a second lead extending proximate the Ohmic contact layer, wherein the plurality of gamma detectors are positioned within the housing such that each gamma detector of the plurality of gamma detectors is radially offset relative to an adjacent gamma detector of the plurality of gamma detectors, such that the first and second leads of each gamma detector are offset relative to the first and second leads of the adjacent gamma detector.

Clause 2: The in-core detector according to clause 1, wherein the housing includes a tube extending in an axial direction, wherein the tube is configured to define an internal cavity, and wherein the plurality of gamma detectors are axially stacked within the internal cavity.

Clause 3: The in-core detector according to clauses 1 or 2, wherein the photoelectron source material is positioned a distance away from the Schottky contact, thereby creating a gap between the photoelectron source material and the Schottky contact, wherein the dimension can be adjusted to attenuate the gap, and wherein attenuating the gap attenuates the amount of energy detected by each gamma detector of the plurality of gamma detectors.

Clause 4: The in-core detector according to any of clauses 1-3, wherein the distance is predetermined to create a gap between the Schottky contact and the photoelectron source material, such that each gamma detector of the plurality of gamma detectors is configured to detect gamma radiation greater than or equal to 5 MeV.

Clause 5: The in-core detector according to any of clauses 1-4, wherein each gamma detector of the plurality of gamma detectors further includes: a fluid interposed between the Schottky contact and the photoelectron source material, wherein the fluid includes a predetermined effective atomic number and a negligible conductance; and an intermediate material covering the Schottky diode, the Ohmic contact, the photoelectron source material, at least a portion of the first lead, and at least a portion of the second lead, wherein the intermediate layer is configured to electrically isolate each gamma detector of the plurality of gamma detectors.

Clause 6: The in-core detector according to any of clauses 1-5, wherein the fluid interposed between the Schottky contact and the photoelectron source material includes air.

Clause 7: The in-core detector according to any of clauses 1-6, wherein the intermediate layer includes at least one of aluminum oxide and magnesium oxide, or combinations thereof.

Clause 8: The in-core detector according to any of clauses 1-7, wherein each gamma detector of the plurality of gamma detectors further includes an outer material covering the intermediate material, wherein the outer material is configured to provide each gamma detector of the plurality of gamma detectors structural integrity.

Clause 9: The in-core detector according to any of clauses 1-8, wherein the outer material includes stainless steel.

Clause 10: The in-core detector according to any of clauses 1-9, wherein the photoelectron source material includes platinum.

Clause 11: The in-core detector according to any of clauses 1-10, wherein the active semiconductor region includes silicon carbide.

Clause 12: An in-core detector system configured to measure gamma radiation emitted by a nuclear reactor, the in-core detector system including a housing configured to be placed in a predetermined location within the nuclear reactor, wherein the housing extends in an axial dimension a plurality of gamma detectors stacked axially within the housing, wherein each gamma detector of the plurality of gamma detectors includes a Schottky diode including an active semiconductor region and a Schottky contact over at least a portion of the active semiconductor region, and a photoelectron source material, wherein the photoelectron source material is configured to produce energy that penetrates the active region when it contacts gamma radiation emitted by the nuclear reactor.

Clause 13: The in-core detector according to clause 12, wherein the housing includes a tube extending in an axial direction, wherein the tube is configured to define an internal cavity, and wherein the plurality of gamma detectors are axially stacked within the internal cavity.

Clause 14: The in-core detector according to clause 12 or 13, wherein the photoelectron source material is positioned a distance away from the Schottky contact, thereby creating a gap between the photoelectron source material and the Schottky contact, wherein the dimension can be adjusted to attenuate the gap, and wherein attenuating the gap attenuates the amount of energy detected by each gamma detector of the plurality of gamma detectors.

Clause 15: The in-core detector according to any of clauses 12-14, wherein each gamma detector of the plurality of gamma detectors further includes a first lead and a second lead, and wherein the first lead and second lead are positioned a predetermined distance from each other, and wherein the predetermined distance is associated with a difference in voltage generated by each gamma detector of the plurality of gamma detectors.

Clause 16: A gamma detector of a plurality of gamma detectors stacked axially within a housing of an in-core detector system, wherein the plurality of gamma detectors are configured to measure gamma radiation emitted by a nuclear reactor, and wherein each gamma detector of the plurality of gamma detectors includes a Schottky diode including an active semiconductor region and a Schottky contact over at least a portion of the active semiconductor region, a conductive material configured to generate a charge within the active semiconductor region, and a photoelectron source material, wherein the photoelectron source material is configured to produce energy that penetrates the active region when it contacts gamma radiation emitted by the nuclear reactor, wherein the photoelectron source material is positioned a distance away from the Schottky contact, thereby creating a gap between the photoelectron source material and the Schottky contact.

Clause 17: The gamma detector according to clause 16, wherein the dimension can be adjusted to attenuate the gap, and wherein attenuating the gap attenuates the amount of energy detected by each gamma detector of the plurality of gamma detectors.

Clause 18: The gamma detector according to clause 16 or 17, wherein the conductive material is configured to produce an electron differential within the active semiconductor region and thus, a reverse bias.

Clause 19: The gamma detector according to any of clauses 16-18, further including an insulating material positioned between the Schottky contact and the conductive material, wherein the insulating material is configured to prevent an unintentional discharge of electrons.

Clause 20: The gamma detector according to any of clauses 16-19, further including a layer of fluid disposed between the Schottky contact and the photoelectron source material, wherein the fluid includes a predetermined effective atomic number and a negligible conductance.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative aspects. The aspects described herein are understood as providing illustrative features of varying detail of various aspects of the disclosed invention; and therefore, unless otherwise specified, it is to be understood that, to the extent possible, one or more features, elements, components, constituents, ingredients, structures, modules, and/or aspects of the disclosed aspects may be combined, separated, interchanged, and/or rearranged with or relative to one or more other features, elements, components, constituents, ingredients, structures, modules, and/or aspects of the disclosed aspects without departing from the scope of the disclosed invention. Accordingly, it will be recognized by persons having ordinary skill in the art that various substitutions, modifications or combinations of any of the exemplary aspects may be made without departing from the scope of the invention. In addition, persons skilled in the art will recognize, or be able to ascertain using no more than routine experimentation, many equivalents to the various aspects of the invention described herein upon review of this specification. Thus, the invention is not limited by the description of the various aspects, but rather by the claims.

What is claimed is:

1. An in-core detector configured to measure a power distribution in a nuclear reactor, the in-core detector comprising:
    a housing configured to be placed within a predetermined location of the nuclear reactor; and
    a plurality of gamma detectors, wherein each gamma detector of the plurality of gamma detectors comprises a Schottky contact, an Ohmic contact, a photoelectron source material, a first lead extending proximate the source material, and a second lead extending proximate the Ohmic contact;
    wherein the plurality of gamma detectors are positioned within the housing such that each gamma detector of the plurality of gamma detectors is radially offset relative to an adjacent gamma detector of the plurality of gamma detectors, such that the first and second leads of each gamma detector are offset relative to the first and second leads of the adjacent gamma detector.

2. The in-core detector of claim 1, wherein the housing comprises a tube extending in an axial direction, wherein the tube is configured to define an internal cavity, and wherein the plurality of gamma detectors are axially stacked within the internal cavity.

3. The in-core detector of claim 1, wherein the photoelectron source material is positioned a distance away from the Schottky contact, thereby creating a gap between the photoelectron source material and the Schottky contact, wherein a dimension can be adjusted to attenuate the gap, and wherein attenuating the gap attenuates an amount of energy detected by each gamma detector of the plurality of gamma detectors.

4. The in-core detector of claim 3, wherein the distance is predetermined to create a gap between the Schottky contact and the photoelectron source material, such that each gamma detector of the plurality of gamma detectors is configured to detect gamma radiation greater than or equal to 5 MeV.

5. The in-core detector of claim 1, wherein each gamma detector of the plurality of gamma detectors further comprises:
    a fluid interposed between the Schottky contact and the photoelectron source material, wherein the fluid comprises a predetermined effective atomic number and a negligible conductance; and
    an intermediate material covering the Schottky contact, the Ohmic contact, the photoelectron source material, at least a portion of the first lead, and at least a portion of the second lead, wherein the intermediate material is configured to electrically isolate each gamma detector of the plurality of gamma detectors.

6. The in-core detector of claim 5, wherein the fluid interposed between the Schottky contact and the photoelectron source material comprises air.

7. The in-core detector of claim 5, wherein the intermediate material comprises at least one of aluminum oxide and magnesium oxide, or combinations thereof.

8. The in-core detector of claim 5, wherein each gamma detector of the plurality of gamma detectors further comprises an outer material covering the intermediate material, wherein the outer material is configured to provide structural integrity for each gamma detector of the plurality of gamma detectors.

9. The in-core detector of claim 8, wherein the outer material comprises stainless steel.

10. The in-core detector of claim 1, wherein the photoelectron source material comprises platinum.

11. The in-core detector of claim 1, wherein each gamma detector of the plurality of gamma detectors comprises an active semiconductor region, and wherein the active semiconductor region comprises silicon carbide.

12. An in-core detector configured to measure a power distribution in a nuclear reactor, the in-core detector comprising:
   a housing configured to be placed within a predetermined location of the nuclear reactor;
   a first gamma detector comprising a first Schottky contact, a first Ohmic contact, and a first photoelectron source material, a first lead extending proximate the first source material, and a second lead extending proximate the first Ohmic contact; and
   a second gamma detector comprising a second Schottky contact, a second Ohmic contact, and a second photoelectron source material, a first lead extending proximate the second source material, and a second lead extending proximate the second Ohmic contact;
   wherein the first gamma detector and the second gamma detector are positioned within the housing such that the first gamma detector and the second gamma detector are radially offset such that:
      the first lead of the first gamma detector is radially spaced apart from the first lead of the second gamma detector; and
      the second lead of the first gamma detector is radially spaced apart from the second lead of the second gamma detector.

13. The in-core detector of claim 12, wherein the housing comprises a tube extending in an axial direction, wherein the tube is configured to define an internal cavity, and wherein the first gamma detector and the second gamma detector are axially stacked within the internal cavity.

14. The in-core detector of claim 12, wherein the first photoelectron source material is positioned a distance away from the first Schottky contact, thereby creating a gap between the first photoelectron source material and the first Schottky contact, wherein a dimension can be adjusted to attenuate the gap, and wherein attenuating the gap attenuates an amount of energy detected by the first gamma detector.

15. The in-core detector of claim 14, wherein the distance is predetermined to create a gap between the first Schottky contact and the first photoelectron source material, such that the first gamma detector is configured to detect gamma radiation greater than or equal to 5 MeV.

16. The in-core detector of claim 12, wherein the first gamma detector comprises:
   a fluid interposed between the first Schottky contact and the first photoelectron source material, wherein the fluid comprises a predetermined effective atomic number and a negligible conductance; and
   an intermediate material covering the first Schottky contact, the first Ohmic contact, the first photoelectron source material, at least a portion of the first lead of the first gamma detector, and at least a portion of the second lead of the first gamma detector, wherein the intermediate material is configured to electrically isolate the first gamma detector from the second gamma detector.

17. The in-core detector of claim 16, wherein the fluid interposed between the first Schottky contact and the first photoelectron source material comprises air.

18. The in-core detector of claim 16, wherein the intermediate material comprises at least one of aluminum oxide and magnesium oxide, or combinations thereof.

19. The in-core detector of claim 16, wherein the first gamma detector further comprises an outer material covering the intermediate material, wherein the outer material is configured to provide structural integrity to the first gamma detector.

20. The in-core detector of claim 19, wherein the outer material comprises stainless steel.

21. The in-core detector of claim 12, wherein one of the first photoelectron source material or the second photoelectron source material comprises platinum.

22. The in-core detector of claim 12, wherein one of the first gamma detector or the second gamma detector comprises an active semiconductor region, and wherein the active semiconductor region comprises silicon carbide.

* * * * *